US012135352B2

(12) United States Patent
Kushnick et al.

(10) Patent No.: US 12,135,352 B2
(45) Date of Patent: Nov. 5, 2024

(54) RANDOM NUMBER GENERATION TESTING SYSTEMS AND METHODS

(71) Applicant: Advantest Corporation, Tokyo (JP)

(72) Inventors: Marilyn Kushnick, San Jose, CA (US); Duane Champoux, San Jose, CA (US)

(73) Assignee: Advantest Corporation, Tokyo (JP)

( * ) Notice: Subject to any disclaimer, the term of this patent is extended or adjusted under 35 U.S.C. 154(b) by 654 days.

(21) Appl. No.: 17/219,521

(22) Filed: Mar. 31, 2021

(65) Prior Publication Data

US 2021/0302496 A1  Sep. 30, 2021

Related U.S. Application Data

(60) Provisional application No. 63/002,854, filed on Mar. 31, 2020.

(51) Int. Cl.
*G01R 31/317* (2006.01)
*G06F 7/58* (2006.01)

(52) U.S. Cl.
CPC .  *G01R 31/31707* (2013.01); *G01R 31/31722* (2013.01); *G01R 31/31724* (2013.01); *G06F 7/582* (2013.01)

(58) Field of Classification Search
CPC ........ G01R 31/31707; G01R 31/31722; G01R 31/31724; G06F 7/582
See application file for complete search history.

(56) References Cited

U.S. PATENT DOCUMENTS

| 4,527,798 | A |   | 7/1985 | Siekierski et al. |
|---|---|---|---|---|
| 5,033,048 | A | * | 7/1991 | Pierce .................... G11C 29/20 714/739 |
| 8,244,784 | B2 |   | 8/2012 | Aharoni et al. |
| 8,531,247 | B2 |   | 9/2013 | Dichtl |

(Continued)

FOREIGN PATENT DOCUMENTS

CN  109271136 A  1/2019

OTHER PUBLICATIONS

Mehrdad Majzoobi; FPGA-based True Random Number Generation Using Circuit Metastability with Adaptive Feedback Control; Rice University; Rice University, ECE; Massachusetts Institute of Technology, EECS; pp. 20; 2015.

*Primary Examiner* — Elias Desta

(57) ABSTRACT

Presented embodiments facilitate efficient and effective flexible implementation of different types of testing procedures in a test system. Presented embodiments enable efficient and effective random generation of test input information. In one embodiment a method includes accessing a plurality of data values to write to a DUT, generating a plurality of addresses pseudo randomly and assigning the address to a respective one of the data values, wherein assignments of a particular address to different respective ones of the data values are randomly repeatable; and directing writing of the data values to the DUT in accordance with the plurality of addresses that are randomly generated and randomly repeated. The generating a plurality of addresses randomly can include normalization. Generating a plurality of addresses pseudo randomly and assigning the address to a respective one of the data values can include performing a confirmation check. The confirmation check can include checking if the addresses within proper parameters.

20 Claims, 13 Drawing Sheets

(56) References Cited

U.S. PATENT DOCUMENTS

| | | | |
|---|---|---|---|
| 9,317,252 B2 | 4/2016 | Roy et al. | |
| 11,762,876 B2* | 9/2023 | Hazel | G06F 16/258 |
| | | | 707/803 |
| 2004/0030734 A1 | 2/2004 | Wells et al. | |
| 2008/0215938 A1* | 9/2008 | Lee | G11C 29/40 |
| | | | 714/719 |
| 2009/0110197 A1 | 4/2009 | Michaels | |
| 2014/0304316 A1 | 10/2014 | Thulasiraman et al. | |
| 2015/0293826 A1 | 10/2015 | Sincan et al. | |
| 2019/0187957 A1 | 6/2019 | Avital et al. | |

* cited by examiner

| | | | | | |
|---|---|---|---|---|---|
| T1A | Table A 010 | Address 010 | T1B | Table A 000 | Address 000 |
| | Table C 010 | Value 11000 | | Table B 001 | Value 101 |
| T2A | Table A 000 | Address 000 | T2B | Table A 000 | Address 000 |
| | Table C 000 | Value 10100 | | Table B 010 | Value 110 |
| T3A | Table A 001 | Address 001 | T3B | Table A 001 | Address 001 |
| | Table C 001 | Value 10011 | | Table B 000 | Value 100 |
| T4A | Table A 100 | Address 100 | T4B | Table A 100 | Address 100 |
| | Table C 100 | Value 01100 | | Table B 001 | Value 101 |
| T5A | Table A 000 | Address 000 | T5B | Table A 000 | Address 000 |
| | Table C 000 | Value 10100 | | Table B 010 | Value 110 |
| T6A | Table A 010 | Address 010 | T6B | Table A 000 | Address 000 |
| | Table C 010 | Value 11000 | | Table B 001 | Value 101 |
| T7A | Table A 000 | Address 000 | T7B | Table A 111 | Address 111 |
| | Table C 000 | Value 10100 | | Table B 011 | Value 111 |
| T8A | Table A 000 | Address 000 | T8B | Table A 000 | Address 000 |
| | Table C 000 | Value 10100 | | Table B 001 | Value 101 |
| T9A | Table A 000 | Address 000 | T9B | Table A 000 | Address 000 |
| | Table C 000 | Value 10100 | | Table B 001 | Value 101 |
| T10A | Table A 101 | Address 110 | T10B | Table A 000 | Address 000 |
| | Table C 101 | Value 10101 | | Table B 010 | Value 110 |
| T11A | Table A 001 | Address 001 | T11B | Table A 001 | Address 001 |
| | Table C 001 | Value 10011 | | Table B 011 | Value 111 |
| T12 | Table A 100 | Address 100 | T12B | Table A 100 | Address 100 |
| | Table C 100 | Value 01100 | | Table B 001 | Value 101 |

FIG. 6

| T1C | Table A 000 | Address 000 |
| | Table C 001 | Value 10011 |

| T2C | Table A 000 | Address 000 |
| | Table C 010 | Value 10000 |

| T3C | Table A 001 | Address 001 |
| | Table C 000 | Value 10100 |

| T4C | Table A 100 | Address 100 |
| | Table C 001 | Value 10011 |

| T5C | Table A 000 | Address 000 |
| | Table C 100 | Value 01100 |

| T6C | Table A 000 | Address 000 |
| | Table C 001 | Value 10011 |

| T7C | Table A 110 | Address 110 |
| | Table C 011 | Value 00110 |

| T8C | Table A 010 | Address 010 |
| | Table C 001 | Value 10011 |

| T9C | Table A 000 | Address 000 |
| | Table C 101 | Value 10011 |

| T10C | Table A 000 | Address 000 |
| | Table C 010 | Value 10000 |

| T11C | Table A 001 | Address 001 |
| | Table C 011 | Value 00110 |

| T12C | Table A 100 | Address 100 |
| | Table C 001 | Value 10011 |

| T13C | Table A 000 | Address 000 |
| | Table C 001 | Value 10011 |

| T14C | Table A 011 | Address 011 |
| | Table C 010 | Value 10000 |

| T15C | Table A 001 | Address 001 |
| | Table C 001 | Value 10011 |

| T16C | Table A 100 | Address 100 |
| | Table C 001 | Value 10011 |

| T17C | Table A 110 | Address 110 |
| | Table C 100 | Value 01100 |

| T18C | Table A 000 | Address 000 |
| | Table C 001 | Value 10011 |

| T19C | Table A 111 | Address 111 |
| | Table C 011 | Value 00110 |

| T20C | Table A 000 | Address 000 |
| | Table C 001 | Value 10011 |

| T21C | Table A 000 | Address 000 |
| | Table C 101 | Value 10011 |

| T22C | Table A 000 | Address 000 |
| | Table C 010 | Value 10000 |

| T23C | Table A 101 | Address 101 |
| | Table C 011 | Value 00110 |

| T24C | Table A 100 | Address 100 |
| | Table C 001 | Value 10011 |

1010
Accessing a plurality of data values to write to a DUT.

1020
Generating a plurality of addresses pseudo randomly and assigning the address to a respective one of the data values, wherein assignments of a particular address to different respective ones of the data values are randomly repeatable.

1030
Directing writing of the data values to the DUT in accordance with the plurality of addresses that are randomly generated and randomly repeated.

FIG. 10

RANDOM NUMBER GENERATION TESTING SYSTEMS AND METHODS

RELATED APPLICATIONS

This application claims the benefit of and priority to provisional application 63/002,854 entitled Random Number Generation Systems and Methods filed Mar. 31, 2020, which is incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made significant advances, traditional approaches are often limited in the ability to simulate real world operating conditions.

Testing devices often involves testing components (e.g., memories, storage devices, registers, etc.) associated with an address. Traditional random number generators for generating write addresses go through an entire range of addresses hitting each address once and without intervening repetition. This is usually good for maximum performance as far as checking each possible address in a range, but it does not typically mimic or provide a good replication of how a device may act or be utilized by a system (e.g., by a PC, server, etc.). The prior art approaches often randomly went through all numbers in a range without repeating any of the numbers until all of the numbers in the range had been generated once. However, this situation rarely occurs in the real world.

SUMMARY

Presented embodiments facilitate efficient and effective flexible implementation of different types of testing procedures in a test system. Presented embodiments enable efficient and effective random generation of test input information. In one embodiment a method includes accessing a plurality of data values to write to a DUT, generating a plurality of addresses pseudo randomly and assigning the address to a respective one of the data values, wherein assignments of a particular address to different respective ones of the data values are randomly repeatable; and directing writing of the data values to the DUT in accordance with the plurality of addresses that are randomly generated and randomly repeated. The generating a plurality of addresses randomly can include normalization. Generating a plurality of addresses pseudo randomly and assigning the address to a respective one of the data values can include performing a confirmation check. The confirmation check can include checking if the addresses are within proper parameters.

In one embodiment, generating a plurality of addresses pseudo randomly and assigning the address to a respective one of the data values can include identifying parameter limitations, and providing notifications of the parameter limitations. The generating a plurality of addresses pseudo randomly and assigning the address to a respective one of the data values can include compensating to address physical constraints. In one exemplary implementation, generating the plurality of addresses pseudo randomly is implemented by random number generation digital signal processor (DSP) hardware. A portion of the DSP can be configured in a field programmable array (FPGA) component. The DUT can be a storage device. The DUT can be a solid state drive (SSD).

In one embodiment, a system includes a load board configured to couple with a plurality of devices under test (DUTs), test electronics configured to test the plurality of DUTs, wherein the test electronics are coupled to the load board, and a controller configured to direct testing of the plurality of DUTs at least in part based upon random selection of test input information, including random selection of respective address locations within the DUTs. The controller can be coupled to the testing electronics. The controller can include a test input control component configured to generate a plurality of addresses pseudo randomly and assign the addresses to a respective one of plurality of input data values. Assignments of a particular address to different respective ones of the data values can be randomly repeatable. In one exemplary implementation, the assignments of a particular address to different respective ones of the data values can be randomly repeatable until all possible addresses in a particular address range have been selected.

In one embodiment, a portion of the controller pseudo random number generation can be implemented in a field programmable array FPGA component. The controller can include random number generation digital signal processor (DSP) hardware. A portion of the DSP can be implemented in a field programmable array FPGA component. A portion of the DSP can be implemented in dedicated ASIC hardware. The DUT can be memory information storage device. The DUT can be a solid state drive (SSD).

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 6 is a block diagram of exemplary random address selections and corresponding random test input value selections in accordance with one embodiment.

FIG. 7 is a block diagram of exemplary random address selections and corresponding random test input value selections in accordance with one embodiment.

FIG. 10 is a flow chart of an exemplary method in accordance with an embodiment.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments enable efficient and effective random generation of test input information. In one embodiment, random number generation digital signal processor (DSP) systems and methods facilitate efficient and effective simulation testing. The simulation testing can approximate randomness of real-world conditions. In one embodiment, a random number generator circuit is efficiently and advantageously implemented within the digital signal processor (DSP) of a FPGA of a tester system. In one embodiment, random number generation digital signal processor (DSP) systems and methods pseudo randomly generate data/addresses. The pseudo random number generator is capable of repeat addresses (e.g., within a range of addresses, etc.) to better mimic real world conditions (e.g., how a PC actually operates, etc.).

In one exemplary implementation, it does not repeat particular test input values purposely, the repetition of the test input values is also random. For example, the selection of a particular repeated number and timing of the repeat can be random. The generation does not necessarily cover each and every address in the range. There may be two occurrences of a particular address and no occurrence of another particular address. This advantageously provides test results that give a better indication of actual performance for real world implementations. For example, read/write performance of SDDs appears better when each number/address is gone through sequentially, but does not necessarily give accurate indication of performance in real world conditions where a PC randomly repeats numbers/addresses.

Figure 1:
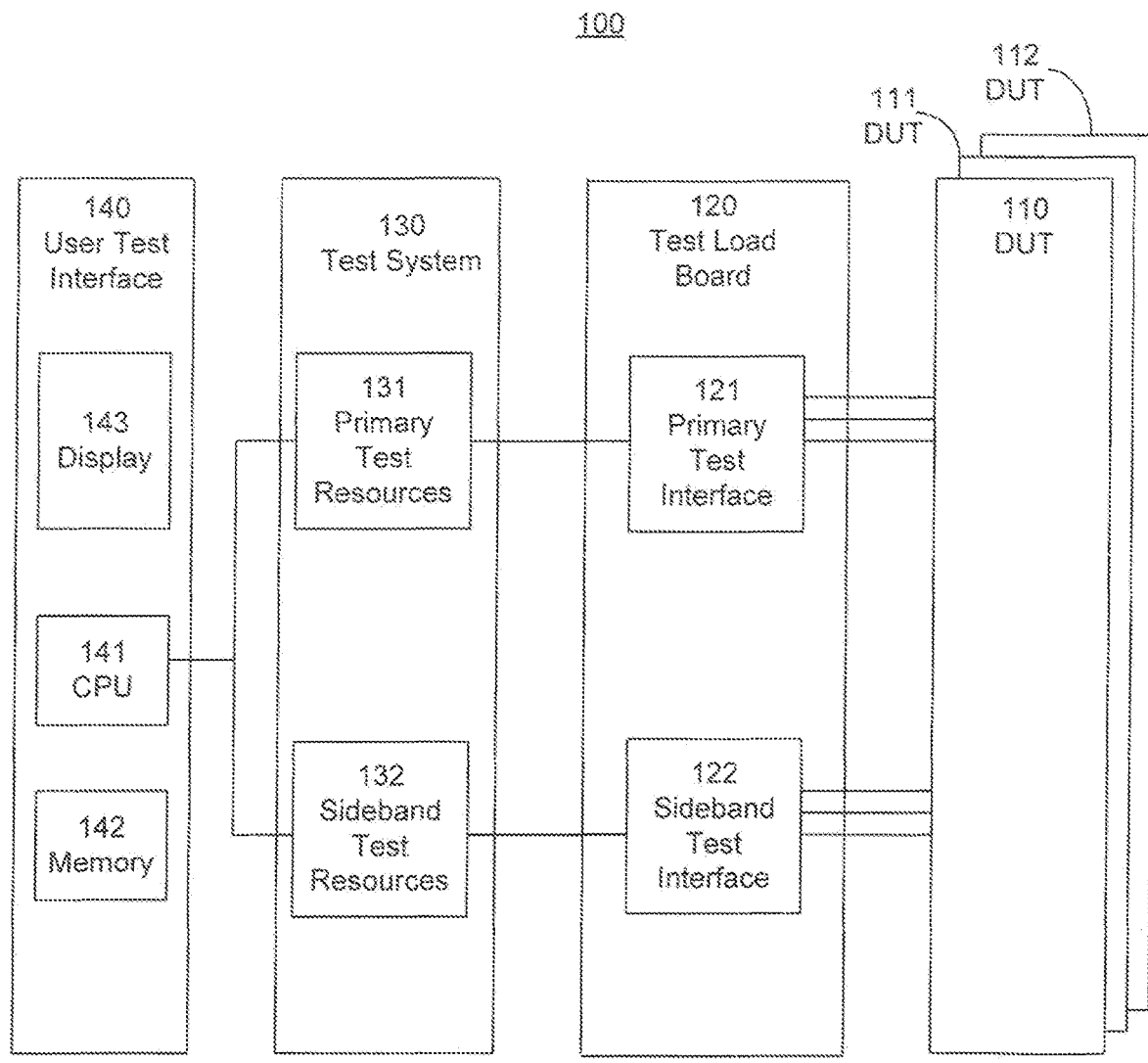
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (DUT) (e.g., 110, 111, 112, etc.), test or load board 120, test equipment 130, and user test interface 140. The DUTs (e.g., 110, 111, 112, etc.) are coupled to the test load board 120 which is coupled to test equipment 130, which in turn is coupled to the CPU 141. In one embodiment, the test load board 120 includes primary or persistent test interface 121 and sideband interface 122. Load board 120 is configured to electrically and physically couple the DUTs to the test equipment 130. Test equipment 130 direct and controls testing of the DUTs and includes resources that are assigned to the respective DUTs. In one exemplary implementation, resources are assigned to DUT 110 as primary test resources 131 and sideband resources 132. Test equipment 130 can include a Field Programmable Gate Array (FPGA). In one embodiment, test various information (e.g., test results, preliminary analysis results, reconfigured test information, testing directions, etc.) is communicated between test equipment 130 and user test interface 140. User test interface 140 includes processing unit 141, memory 142, and display 143. Memory 142 can store testing related information, processing unit 141 can process the information, and display 143 can display the information.

In one embodiment, test equipment can include a test input control component. The test input control component can be included in a FPGA of the test equipment. In one exemplary implementation, a test input control component can randomly generate test input information (e.g., DUT addresses, input DUT test data, etc.). In one exemplary implementation, a test input control component can direct operations of primary test resources 131 and sideband resources 132 in accordance with randomly generated test input information.

Figure 2:
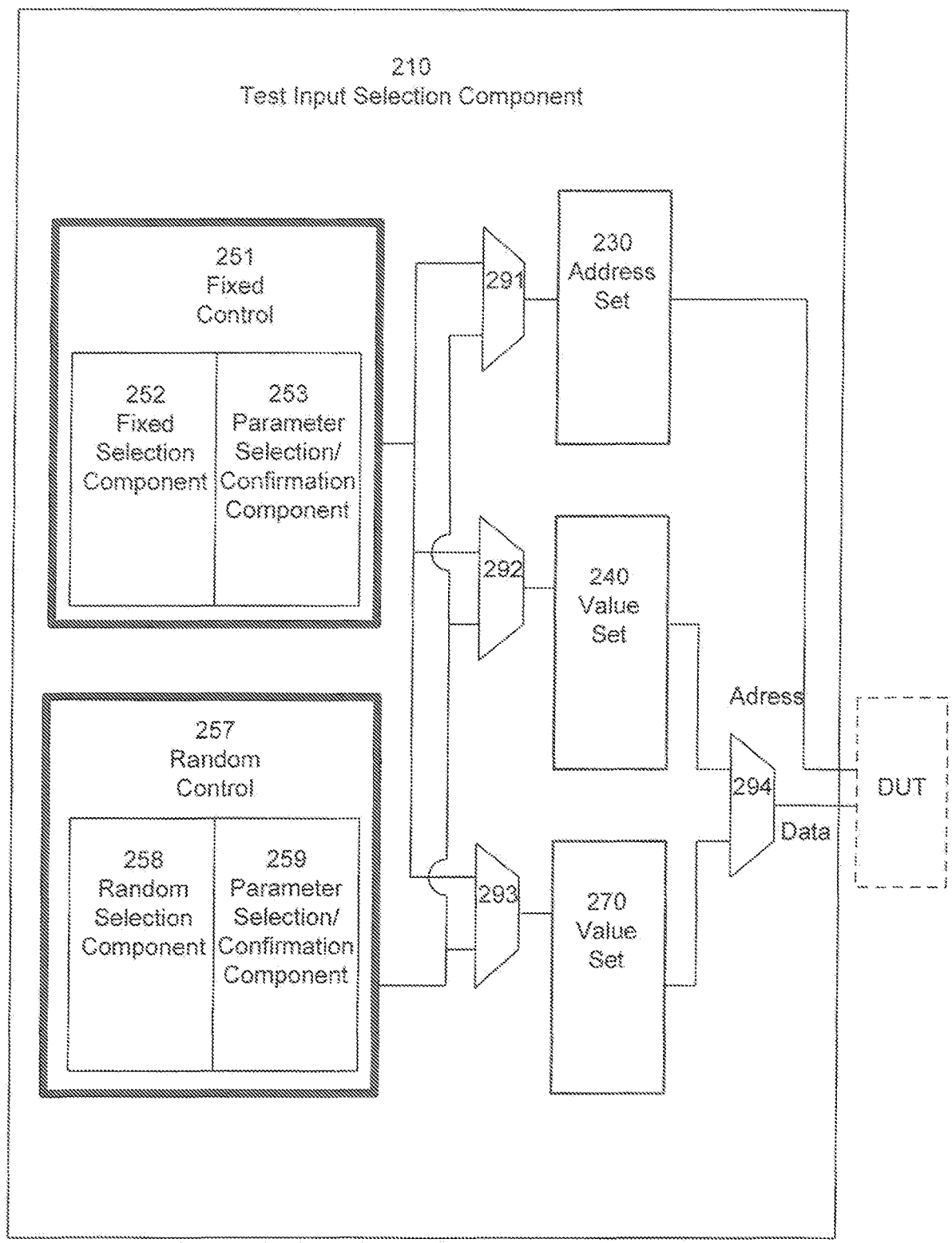
FIG. 2 is a block diagram of an exemplary test input control component in accordance with one embodiment.

FIG. 2 is a block diagram of an exemplary test input control component 210 in accordance with one embodiment. In one exemplary implementation, test input control component 210 is included in test equipment (e.g., similar to test equipment 130, etc.). Test input control component 210 includes fixed control component 251, random control component 257, address set 230, first input value set 240, second input value set 270, and switches (e.g., multiplexers, crossbar, etc.) 291, 292, 293, and 294. Fixed control component 251 includes fixed selection component 252 and parameter selection confirmation component 253. Random control component 257 includes random selection component 258 and parameter selection confirmation component 259. Fixed control component 251 and random control component 257 are coupled to switches 291, 292, and 293. Switches 291, 292 and 293 are coupled to address set 230, first input value set 240, and second input value set 270, respectively. First input value set 240 and second input value set 270 are coupled to switch 294.

The components of test input control component 210 cooperatively operate to provide test data input for test DUTs. In one embodiment, fixed control component 251 selects input data based upon a fixed selection scheme in which the order of the test inputs and the content of the test inputs are fixed. In one exemplary implementation, the order of the test inputs and the content of the test inputs are predetermined. In one embodiment, random control component 257 selects input data based upon a random selection scheme in which the order of the test inputs and the content of the test inputs are random. It is appreciated there are various degrees and types of randomness that can be utilized to implement test input control. Additional information on the degrees and types of randomness is presented in other portions of this specification. Address set 230 includes a range of possible DUT addresses that can be selected/chosen. Input value set 240 includes a first set of possible data values that can be selected/chosen. Input value set 240 includes a second set of possible data values that can be selected/chosen. Switches 291, 292, and 293 are configured to control which selection scheme (e.g., fixed, random, etc.) is use to select/choose possible DUT addresses and possible data values. Switch 294 is configured to select which input value set (e.g., 240, 270, etc.) provides the test input values.

In one embodiment, the output of a random control component can be forwarded directly as the selected address without going through an address set. In one exemplary implementation, the output of the random control component is the proper number and configuration of logical bits that correspond directly to a DUT address.

Figure 3:
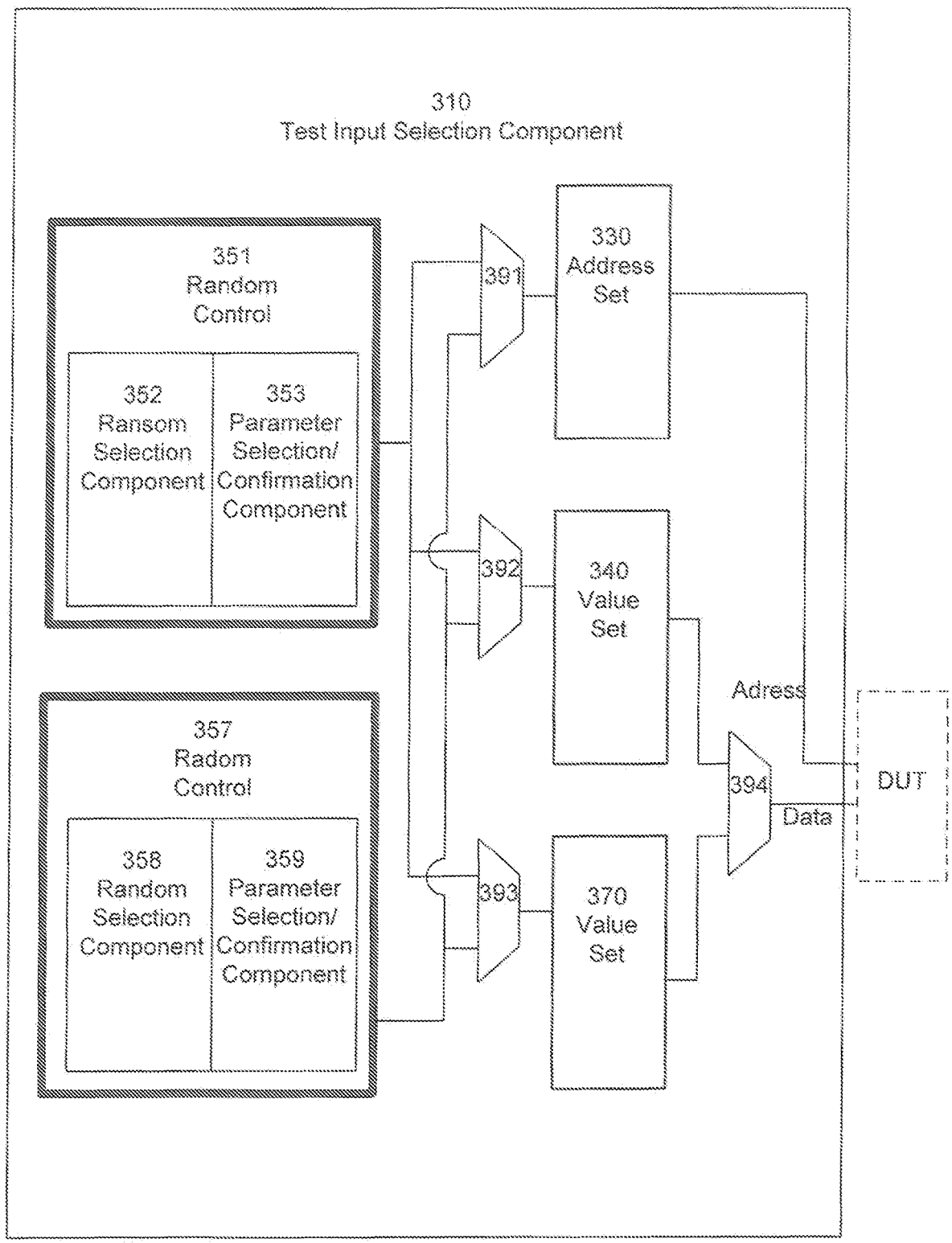
FIG. 3 is a block diagram of an exemplary test input control component in accordance with one embodiment.

FIG. 3 is a block diagram of an exemplary test input control component 310 in accordance with one embodiment. Test input control component 310 includes first random control component 351, second random control component 357, address set 330, first input value set 340, second input value set 370, and switches (e.g., multiplexers, crossbar, etc.) 391, 392, 393, and 394. First random control component 351 includes random selection component 352 and parameter selection confirmation component 353. Random control component 357 includes random selection component 383 and parameter selection confirmation component 359. First random control component 351 and random control component 357 are coupled to switches 391, 392, and 393. Switches 391, 393 and 393 are coupled to address set 330, first input value set 340, and second input value set 370, respectively. First input value set 340 and second input value set 370 are coupled to switch 394.

The components of test input control component 310 cooperatively operate to provide test data input for DUTs. In one embodiment, test input control component 310 is similar to test input control component 210. In one exemplary implementation, test input control component 310 can have a fixed control component (not shown) in addition to random control components 351 and 357. The fixed control component can be similar to fixed control component 251. Random control component 351 can select input data (e.g., DUT addresses, input values, etc.) based upon a first random selection scheme in which the order of the test inputs and the content of the test inputs are random. Random control component 357 can select input data based upon a random selection scheme in which the order of the test inputs and the content of the test inputs are random. Address set 330 includes a range of possible DUT addresses that can be selected/chosen. Input value set 340 includes a first set of possible data values that can be selected/chosen. Input value set 370 includes a second set of possible data values that can be selected/chosen. Switch 394 is configured to select which input value set (e.g., 340, 370, etc.) provides the test input values. Switches 391, 392, and 393 are configured to control which selection scheme (e.g., first random scheme, second random scheme, etc.) is use to select/choose possible addresses and possible data values. It is appreciated there are various degrees and types of test input control randomness that can be implemented.

It is appreciated addresses and test input values can be randomly selected in accordance various random selection schemes. In one embodiment, addresses and test input values are randomly selected and the address and test input values can be repeated. In one embodiment, addresses and test input values are randomly selected and the address are not repeated. In one exemplary implementation, DUT addresses and test input values are randomly selected until each of the addresses has been utilized as a test input.

Figure 4:
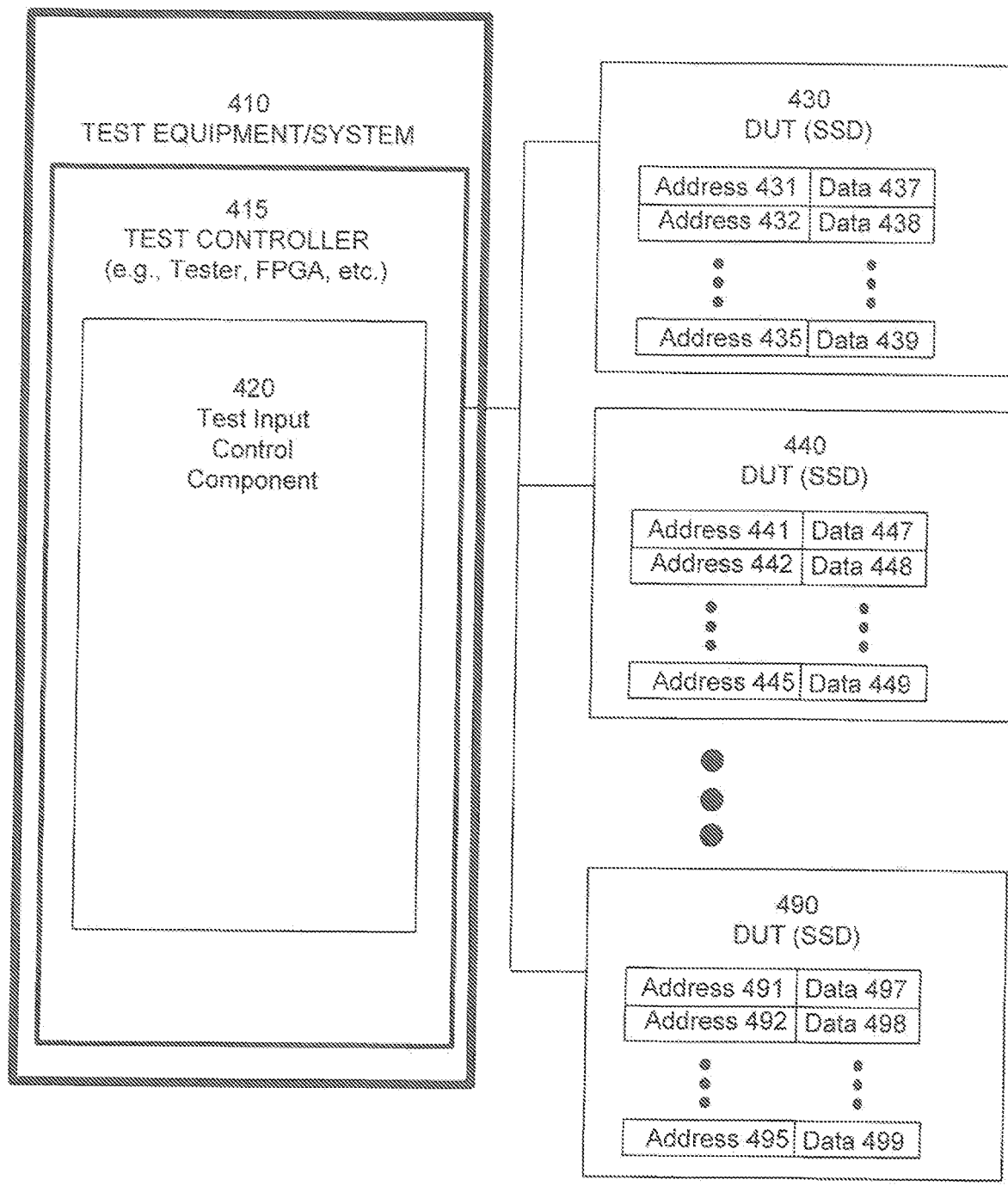
FIG. 4 is a block diagram of exemplary test system in accordance with one embodiment.

FIG. 4 is a block diagram of exemplary test system 400 in accordance with one embodiment. Test system 400 includes test equipment 410 which includes test controller 415 configure to control testing of DUTs (e.g., 430, 440, 490, etc.). Test controller 415 includes test input control component 420 configured to control selection of test input information forwarded to the DUTs. In one embodiment, DUT addresses and test input values are randomly selected. The DUT addresses can indicate storage locations/addresses within the DUT where the corresponding test input values are stored. In one embodiment, DUT 430, 440, and 490 are coupled to test system 400. The DUTs can be information storage devise or memories. DUT 430 is configured with addresses indicator 431, 432, and 435 with corresponding data storage locations 437, 438, and 439. DUT 440 is configured with addresses indicator 441, 442, and 445 with corresponding data storage locations 447, 434, and 449. DUT 490 is configured with addresses indicator 491, 492, and 495 with corresponding data storage locations 497, 494, and 499. In one exemplary implementation, the DUT 430, 440, and 490 are solid state drives (SSDs).

The components of test equipment system 410 cooperatively operate to test DUTs (e.g., 430, 440, and 490, etc.), including providing test data input configured to test the DUTs. Test input control component 420 can control selection of addresses and test input values. In one embodiment, addresses and test input values can be randomly selected/chosen. In one exemplary implementation, test controller 415 is a field programmable gate array (PFGA) and test input controller component 420 is implemented in hardware. Test input controller component 420 is similar to other test input controller components in this specification (e.g., 220, 320, 520, etc.).

Figure 5:
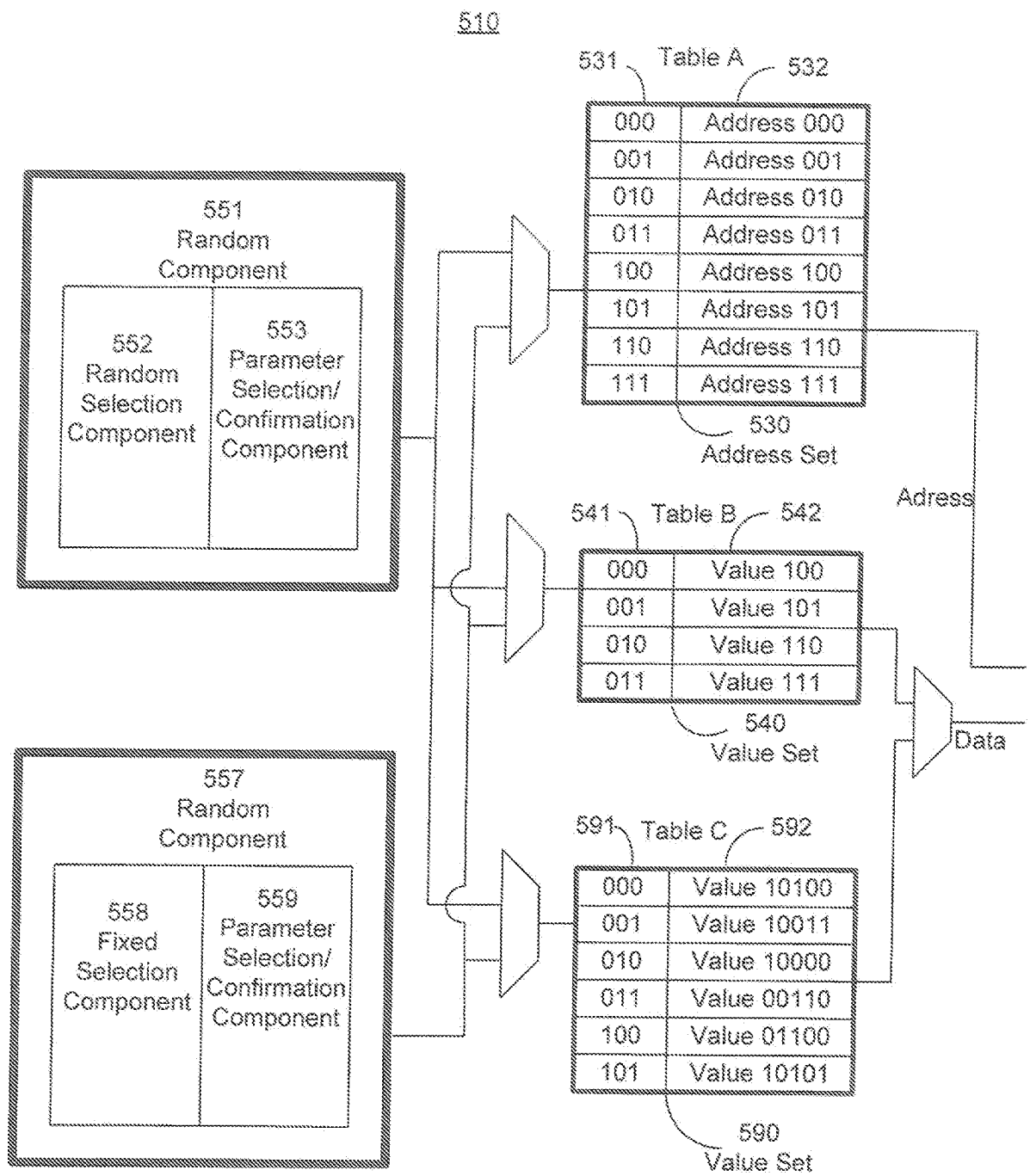
FIG. 5 is a block diagram of an exemplary test input control component in accordance with one embodiment.

FIG. 5 is a block diagram of an exemplary test input control component 510 in accordance with one embodiment. Test input control component 510 includes first random control component 551, second random control component 557, address set 530, first input value set 540, second input value set 570, and switches (e.g., multiplexers, crossbar, etc.) 591, 592, 593, and 594. First random control component 551 includes random selection component 552 and parameter selection confirmation component 553. Random control component 557 includes random selection component 558 and parameter selection confirmation component 559. First random control component 551 and second random control component 557 are coupled to switches 591, 592, and 593. Switches 591, 593 and 593 are coupled to address set 530, first input value set 540, and second input value set 570, respectively. First input value set 540 and second input value set 570 are coupled to switch 594.

The components of test input control component 510 cooperatively operate to provide test data input for test DUTs. In one exemplary implementation, test input control component 510 is similar to test input control component 310. Random control component 551 can select input data (e.g., DUT addresses, input values, etc.) based upon a first random selection scheme in which the order of the test inputs and the content of the test inputs are random. Random control component 557 selects input data based upon a random selection scheme in which the order of the test inputs and the content of the test inputs are random.

It is appreciated there are various different types and content of test input information that can be implemented. In one embodiment, an address set (e.g., 230, 330, 530, etc.) can include a range of possible DUT addresses that can be selected/chosen and an input value set (e.g., 240, 540, 390, 590, etc.) includes a set of possible data values that can be selected/chosen. In one exemplary implementation, address set 530 can configured with a plurality of selection identifiers and corresponding address values, input value set 540 can configured with a plurality of selection identifiers and corresponding data values, and input value set 590 can configured with a plurality of selection identifiers and corresponding data values. A particular selection identifier can be selected/chosen based upon a random generation value corresponding to the selection identifier. Additional description of selection identifiers is presented in other portion of this specification.

A random selection component can be configured so that the selection identifiers are mapped to corresponding data values. In one embodiment, selection identifiers and corresponding data values can be mapped in a configuration similar to a table format. Address set 530 can have a plurality of selection identifiers in a first column 531 that correspond to a plurality of addresses in a second column 532. The selection identifiers in a first column 531 can be mapped respectively to addresses in a second column 532. Input data set 540 can have a plurality of selection identifiers in a first column 541 that correspond to a plurality of addresses in a second column 542. The selection identifiers in a first column 541 can be mapped respectively to addresses in a second column 542. Input data set 590 can have a plurality of selection identifiers in a first column 591 that correspond to a plurality of addresses in a second column 592. The selection identifiers in a first column 591 can be mapped respectively to addresses in a second column 592. The selection identifiers and corresponding data values can be different in respective different input value sets (e.g., 540, 590, etc.).

In one embodiment, it is appreciated addresses and test input values can be randomly selected in accordance various random selection schemes. FIG. 6 is a block diagram of exemplary random address selections and corresponding random test input value selections in accordance with one embodiment. Selections/choices of random addresses are mapped corresponding random test input values over time (e.g., from time T1 to time T12, etc.). In one exemplary implementation, a first random selection scheme results are shown in column 610 and a second random selection scheme results are shown in column 620. In one exemplary implementation, first input value set 540 is associated with the first random selection scheme and the second random selection scheme. In one embodiment, a random selection component (e.g., similar to 251, 351, 551, etc.) can generate a random value for a selection identifier and a parameter selection/confirmation component (e.g., 253, 353, 553, etc.) can ensure the random value is appropriate (e.g., in the correct configuration, correct range, etc.). In one exemplary implementation, the random generation is directed to selecting a memory/address and corresponding input data value for an information storage type DUT (e.g., DRAM, SSD, etc.).

In one embodiment, at time T1A random selection component 551 randomly generates a value 010 that is used as a selection identification value 010. Address set 530 indicates selection identification value 010 corresponds to address 010, which is forwarded as the test address for the DUT. Input value set 590 indicates selection identification value 010 corresponds to input data value 10000, which is also forwarded to the DUT for storage in address location 010. The results are shown in FIG. 6 illustrating that at time T1 the randomly generated selection ID value 010 shown in block 620 resulted in address 010 shown in block 640 and randomly generated selection ID value 010 shown in block 630 resulted in data value 1000 shown in block 650. In one exemplary implementation, column 610 is associated with a first random selection scheme results, in which randomly selected address and test input values can be repeated. It is also possible that not every possible address has been selected/chosen (e.g., addresses 011 and 111 are not selected in column 610).

In one exemplary implementation, column 620 is associated with a second random selection scheme results, in which randomly selected and the address and test input values can be repeated. It is also possible that not every possible address has been selected/chosen. In column 620 random selection component 551 is used to randomly select an address from address set 530 and random selection component 557 is used to randomly select an input data value from value set 540. In one embodiment, at time T1B random selection component 551 randomly generates a value 010 that is used as a section identification value 010 and address set 520 indicates selection identification value 010 corresponds to address 010, which is forwarded as the test address for the DUT. Also, at time T1B random selection component 557 randomly generates a value 001 that is used as a section identification value 001 and input value set 540 indicates selection identification value 001 corresponds to input data value 101, which is also forwarded to the DUT for storage in storage locate 010.

It is appreciated that various selection schemes can be utilized. Selection schemes can include both fixed and random selection. Address selection can be random and input data values fixed selection. Input data value selection can be random and address selection fixed. In one embodiment, addresses and test input values are randomly selected and the addresses are not repeated. In one exemplary implementation, DUT addresses and test input values are randomly selected until each of the addresses has been utilized as a test input.

FIG. 7 is a block diagram of exemplary random address selections and corresponding random test input value selections in accordance with one embodiment. In one embodiment, FIG. 7 illustrate a selection scheme that includes a combination of both random selection of addresses and making sure every address is selected. Random selection component 557 is used to randomly select an address from address set 530 and random selection component 551 is used to randomly select an input data value from value set 590. As illustrated in bold every address is selected at least once with random selection of addresses in between.

Figure 8:
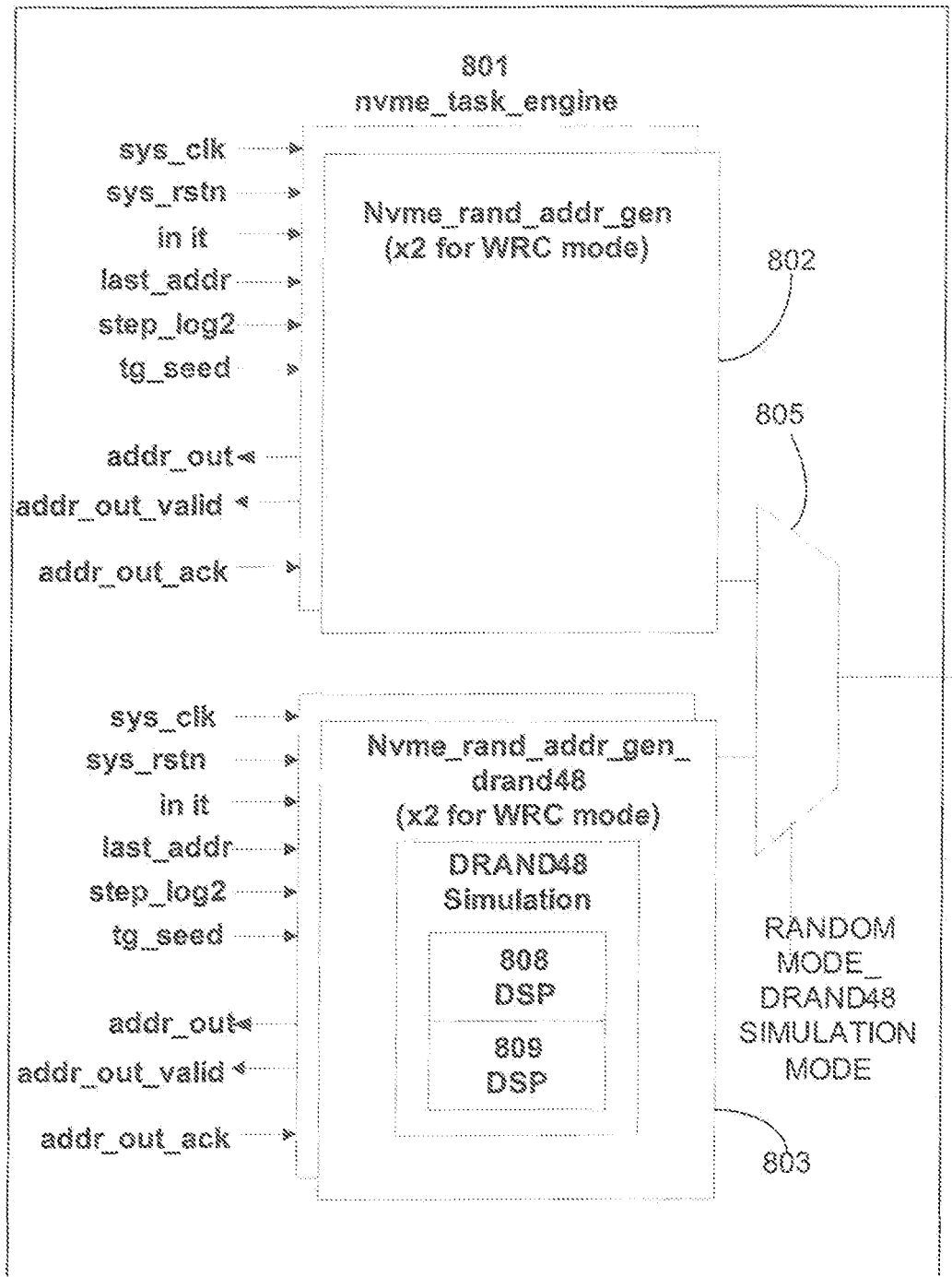
FIG. 8 is a block diagram of an exemplary random number generation digital signal processor (DSP) system and process in accordance with one embodiment.

In one embodiment, a DSP hardware random number generation implementation can produce results similar to software random number generation applications (e.g., LINUX function does a certain algorithm called DRAND48). FIG. 8 is a block diagram of an exemplary random number generation digital signal processor (DSP) system 801 in accordance with one embodiment. Random number generation digital signal processor (DSP) system 801 includes random control component 802, random control component 830 and MUX 805. In one embodiment random control components 801 and 802 are similar to random control component 551 and 557. In one exemplary implementation, random control component 802 is primarily a hardware implementation that simulates results similar to a liner congruential generator (LCG) or DRAND48 generator. In one embodiment, a random number generation approach can use dedicated ASIC hardware (hard/DSP macros) within an FPGA. In one exemplary implementation, the presented random generation address generation hardware systems and methods provide a performance advantage over traditional approaches (e.g., software, etc.).

There can be several additional modifications in the presented hardware random generation implementation over traditional approaches (e.g., pure software type implementations, software DRAND48, etc.) of random generation. The traditional applications typically have fractions, whereas the presented hardware implementations can include normalization to use digital logical 0 and 1. In one embodiment, after receiving the initial normalized number result, several confirmation checks are performed (e.g., is it still within an appropriate range, matches other criteria, is the step/jump size appropriate, is am address block size proper, etc.). In one embodiment, a presented hardware system and method includes compensations to address physical constraints of a test equipment components (e.g., a controller, a FPGA, etc.) while implementing the algorithm in hardware. In one exemplary implementation, the random number generation digital signal processor (DSP) systems and methods are implemented in the controller (e.g., FPGA, etc.). In one embodiment, the hardware implementation can identify and provide notifications of parameter limitations (e.g., including those that are different than the software implementation, etc.).

Figure 9:
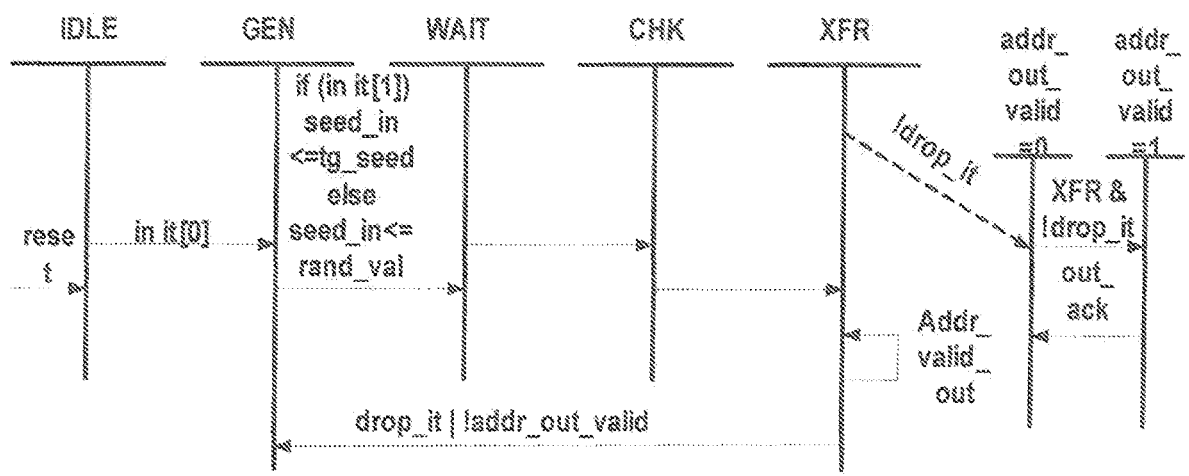
FIG. 9 is flow chart of exemplary timing for a state machine in accordance with one embodiment.

FIG. 9 is flow chart of exemplary timing for a state machine of a random control component in accordance with one embodiment. In one embodiment, a random number is generated and checked to determine if there is a fraction in the result. If there is not a fraction the number is considered valid and if there is a fraction the number is dropped.

FIG. 10 is a flow chart of an exemplary method 1000 in accordance with an embodiment. In one embodiment, the method is a random number generation digital signal processor (DSP) method.

In block 1010, a plurality of data values are accessed for writing to a DUT.

In block 1020, a plurality of addresses are pseudo randomly generated. The plurality of address can be assigned to a respective one of the data values. The assignment of a particular address to different respective ones of the data values can be randomly repeatable. The generating a plurality of addresses pseudo randomly can include normalization.

In one embodiment, the method includes performing a confirmation check. The confirmation check can include checking if the addresses are within proper parameters. In one exemplary implementation, the method includes checking if a pseudo randomly generated address satisfies address parameter limitations, and providing notifications of the parameter limitations. The method can include compensating for address physical constraints.

In block 1030, writing of the data values to the DUT is directed in accordance with the plurality of addresses that are randomly generated and randomly repeated. A confirmation check can include checking if the addresses within proper parameters.

It is appreciated that method 1000 is compatible with various hardware configurations. In one embodiment, a portion of the DSP is implemented in a field programmable array FPGA component. A portion of the DSP can be implemented in dedicated ASIC hardware. A DUT can be a storage device. A DUT can be a solid state drive (SSD).

In one embodiment, random number generation digital signal processor (DSP) systems and methods can be implemented in a test system similar to the one shown in the FIG. 3.

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Thus, presented systems and methods allow both random generation and random repeatability of numbers within an address range. This random generation/repeatability facilitates testing that more closely mimics real world conditions than traditional testing systems and methods. Random number generation digital signal processor (DSP) systems and methods can help avoid misleading indications of how a component that utilizes addresses (e.g., SSD, memory, etc.) is going to perform (e.g., write speed, etc.) in real world in the field applications.

Figure 11:
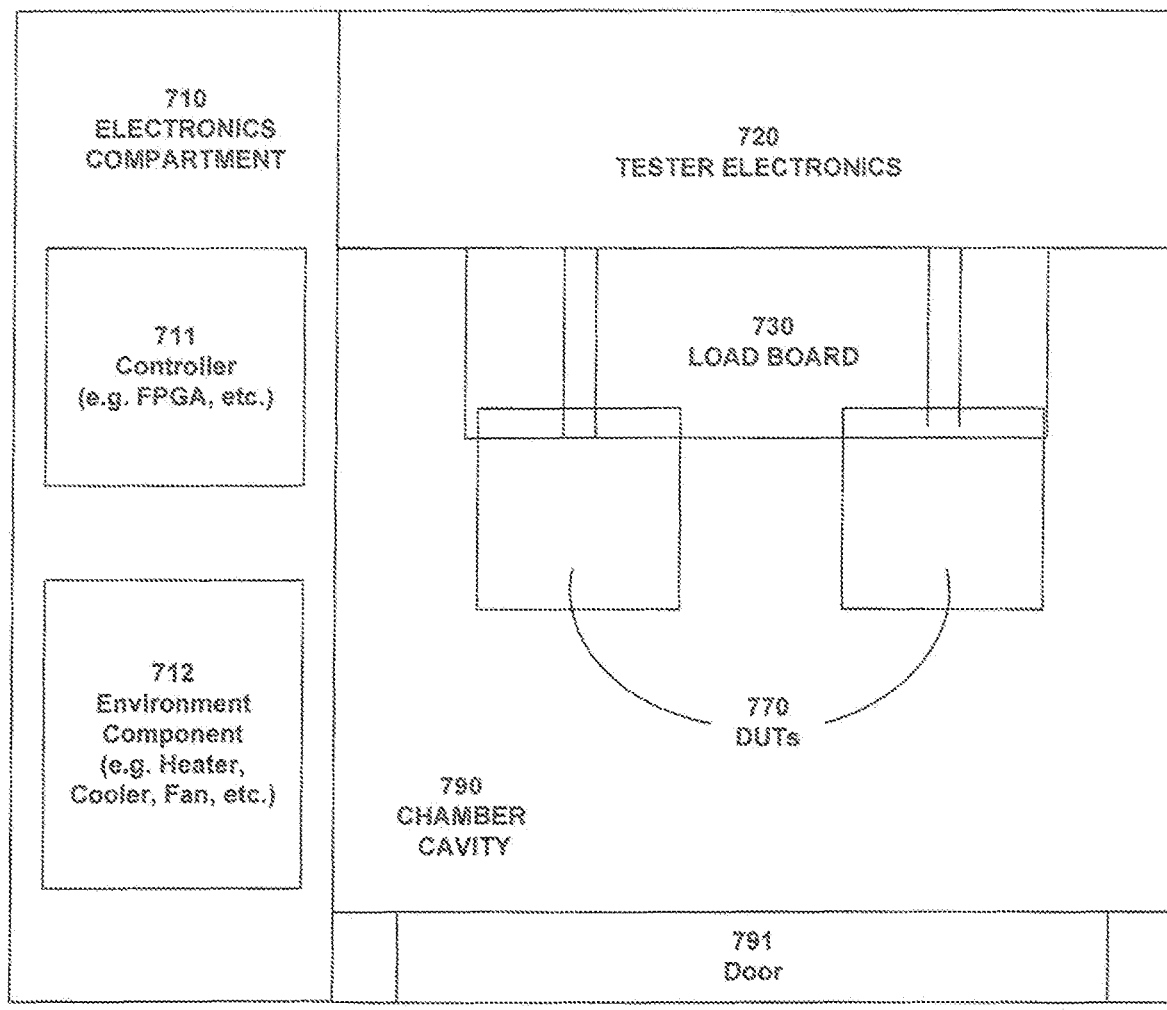
FIG. 11 is a block diagram of an exemplary testing system in accordance with one embodiment.
Figure 12:
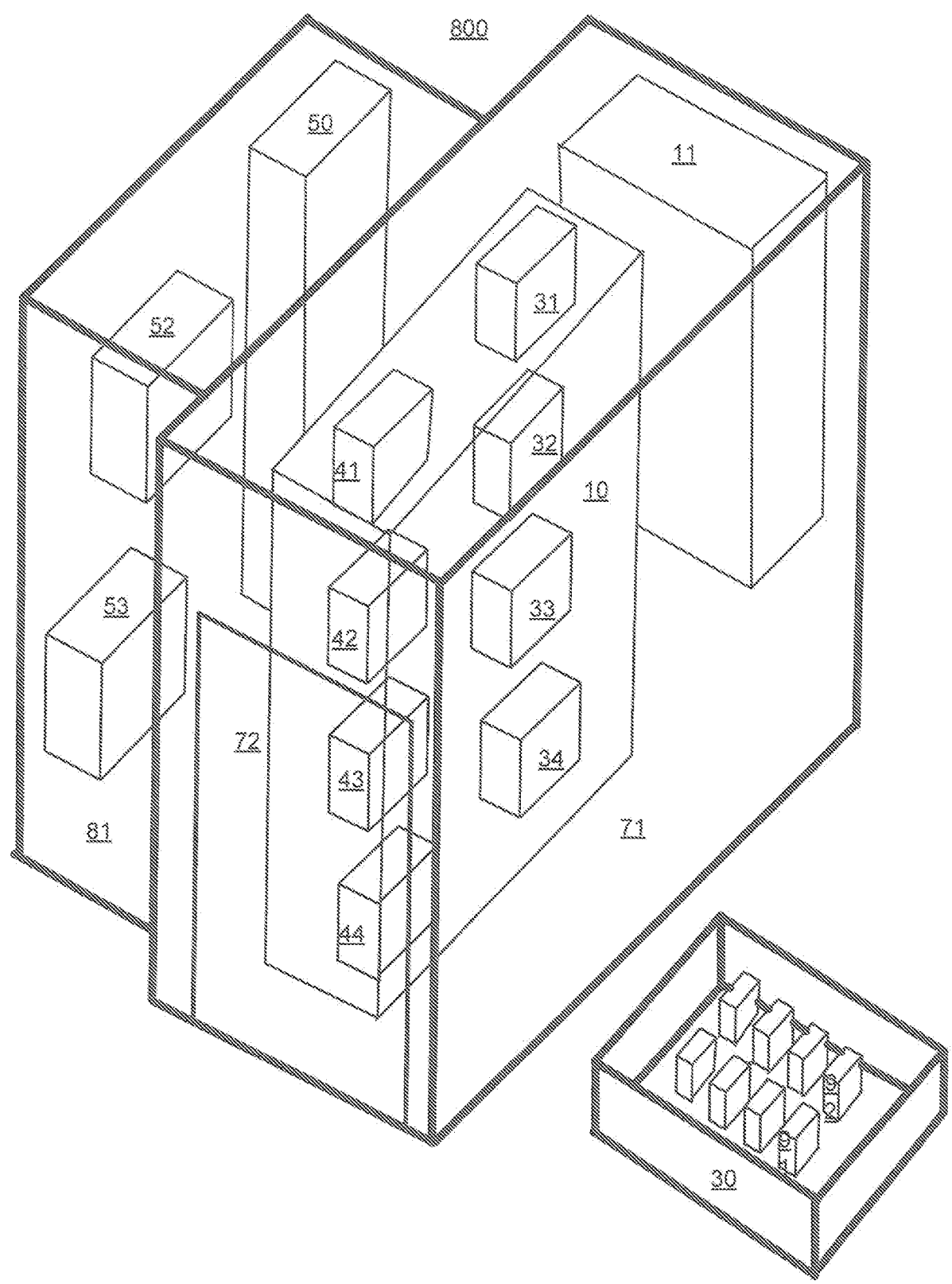
FIG. 12 is a block diagram of an exemplary testing system in accordance with one embodiment.
Figure 13:
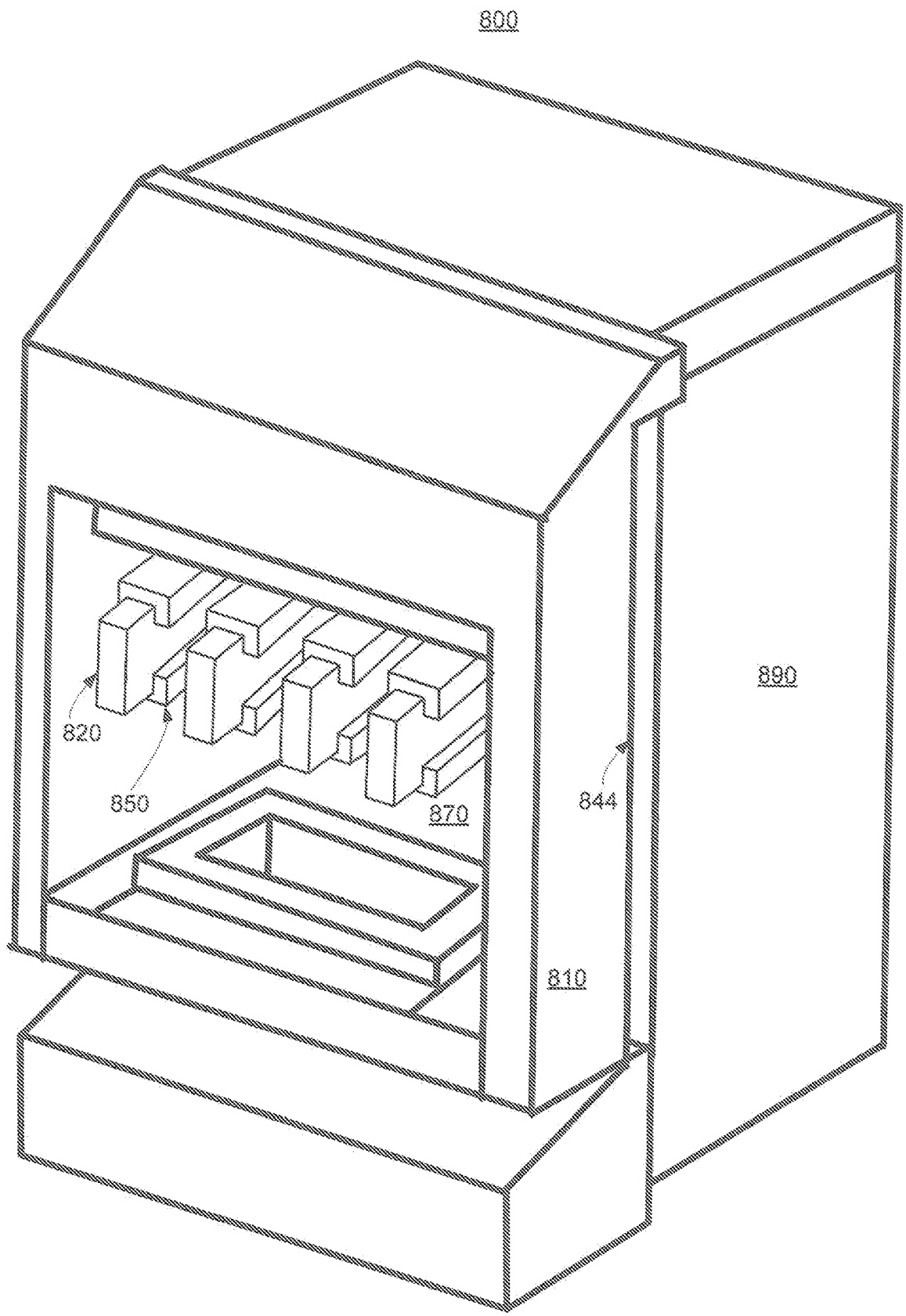
FIG. 13 is a block diagram of an exemplary test system in accordance with one embodiment.

In one embodiment, random selection testing systems and methods can be implemented in test systems similar to the embodiments shown in the FIGS. 11, 12, and 13.

FIG. 11 is a block diagram of an exemplary testing system 500 in accordance with one embodiment. Testing system 500 includes electronics compartment 510 and tester electronics 520, load board 530, DUTs 570, and testing chamber 590 with door 591. Electronics compartment 510 includes controller 511 and environment compartment 512.

It is appreciated that selectable testing systems and methods can be implemented in various testing system configurations or approaches. FIG. 12 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of load board trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The load board trays (e.g., 30, 31, etc.) are connected to tester slices 50 (multiple load board trays can be coupled to a single tester slice). There is also a block diagram of a tester tray 30 and devices under test (e.g., 91, 92, etc.). The load board trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location).

In one embodiment, a test system includes device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their load boards can be conveniently setup to accommodate different device form factors. In one embodiment, load boards are configured with device under test interfaces and universal primitive interfaces. In one exemplary implementation, the device interface board can control an ambient environment of a device under test.

FIG. 13 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The load board is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. While access to test system 800 may be easier than test system 700, test system configuration adapters enable both supplemental operations and functional testing that still offers benefits associated with not requiring the expensive and time-consuming multiple moves of DUTs between separate test systems (unlike conventional test approaches).

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium, it is not intended to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A method, comprising:
accessing a plurality of data values to write to a device under test (DUT);
generating a plurality of addresses pseudo randomly and assigning one of the plurality of addresses to a respective one of the plurality of data values, wherein assignments of the one of the plurality of addresses to different respective ones of the plurality of data values are randomly repeatable within a block before assignment of each of the plurality of addresses in a block; and
directing writing of the plurality of data values to the DUT in accordance with the plurality of addresses that are pseudo randomly generated and randomly repeated.

2. The method of claim 1, wherein the generating the plurality of addresses pseudo randomly comprises normalization.

3. The method of claim 1, wherein the generating the plurality of addresses pseudo randomly and assigning the one of the plurality of addresses to a respective one of the plurality of data values comprises performing a confirmation check.

4. The method of claim 3, wherein a confirmation check comprises checking if the plurality of addresses are within proper parameters.

5. The method of claim 3, wherein the generating the plurality of addresses pseudo randomly and assigning the one of the plurality of addresses to a respective one of the plurality of data values comprises:
identifying parameter limitations; and
providing notifications of the parameter limitations.

6. The method of claim 1, further comprising compensating to address physical constraints.

7. The method of claim 1, wherein generating the plurality of addresses pseudo randomly is implemented by random number generation digital signal processor (DSP) hardware.

8. The method of claim 7, wherein a portion of the random number generation digital signal processor (DSP) hardware is implemented in a field programmable array (FPGA) component.

9. The method of claim 1, wherein the DUT is a solid state drive (SSD).

10. The method of claim 1, wherein the DUT is a storage device.

11. A system comprising:
a load board configured to couple with a plurality of devices under test (DUTs);
test electronics configured to test the plurality of DUTs, wherein the test electronics are coupled to the load board; and
a controller configured to direct testing of the plurality of DUTs at least in part based upon random selection of test input information, including random selection of respective address locations within the plurality of DUTs, in which a portion of the selection of the respective address locations is randomly repeatable before assignment of each of the respective address locations in a block, wherein the controller is coupled to the testing electronics.

12. The system of claim 11, wherein the controller comprises test input control component configured to generate a plurality of addresses pseudo randomly and assign one of the plurality of addresses to a respective one of plurality of input data values.

13. The system of claim 12, wherein assignments of the one of the plurality of addresses to different respective ones of the data values are randomly repeatable.

14. The system of claim 12, wherein assignments of the one of the plurality of addresses to different respective ones of the data values are randomly repeatable until all possible addresses in a particular address range have been selected.

15. The system of claim 11, wherein a portion of the controller comprises pseudo random number generation implemented in a field programmable array FPGA component.

16. The system of claim 15, wherein the controller comprises random number generation digital signal processor (DSP) hardware.

17. The system of claim 16, wherein a portion of the random number generation DSP hardware is implemented in a field programmable array FPGA component.

18. The system of claim 16, wherein a portion of the random number generation DSP hardware is implemented in dedicated ASIC hardware.

19. The system of claim 11, wherein the plurality of DUTs are memory information storage devices.

20. The system of claim 11, wherein the plurality of DUTs are solid state drives (SSDs).

* * * * *